United States Patent
Anpat et al.

(10) Patent No.: US 9,848,378 B2
(45) Date of Patent: Dec. 19, 2017

(54) SELECTIVE ACCESS POINT NAME ASSIGNMENT BASED ON MACHINE-TO-MACHINE TRAFFIC ANALYSIS

(71) Applicant: CISCO TECHNOLOGY, INC., San Jose, CA (US)

(72) Inventors: Sourabh Deepak Anpat, West Drayton (GB); Amit Ghadge, Pune (IN)

(73) Assignee: Cisco Technology, Inc., San Jose, CA (US)

( * ) Notice: Subject to any disclaimer, the term of this patent is extended or adjusted under 35 U.S.C. 154(b) by 209 days.

(21) Appl. No.: 14/455,926

(22) Filed: Aug. 10, 2014

(65) Prior Publication Data

US 2016/0044593 A1 Feb. 11, 2016

(51) Int. Cl.
*H04W 48/20* (2009.01)
*H04W 4/00* (2009.01)
(Continued)

(52) U.S. Cl.
CPC .......... *H04W 48/20* (2013.01); *H04W 4/005* (2013.01); *H04W 36/08* (2013.01); *H04W 36/22* (2013.01); *H04W 48/18* (2013.01)

(58) Field of Classification Search
CPC ..... H04W 48/18; H04W 88/06; H04W 8/082; H04W 28/08; H04W 84/045; H04W 36/14; H04W 76/02; H04W 84/12; H04W 36/22; H04W 80/04; H04W 36/0022; H04W 88/16; H04W 48/08; H04W 76/022
See application file for complete search history.

(56) References Cited

U.S. PATENT DOCUMENTS 8,768,385 B2  7/2014  Chandramouli
2008/0240374 A1* 10/2008 Conway ............. H04M 3/5175
                                                              379/67.1
(Continued)

OTHER PUBLICATIONS

Taleb, Tarik, et al., "Machine Type Communications in 3GPP Networks: Potential, Challenges and Solutions," IEEE Communications Magazine, Mar. 2012, pp. 178-184.

(Continued)

*Primary Examiner* — Charles C Jiang
*Assistant Examiner* — Oussama Roudani
(74) *Attorney, Agent, or Firm* — Patterson + Sheridan, LLP

(57) ABSTRACT

A method is provided in one example embodiment and includes analyzing characteristics of traffic associated with an application in a data communications network; defining each of a plurality of Access Point Names ("APNs") for terminating traffic in the data communications network; comparing the application traffic characteristics with the APNs; and selecting one of the APNs based on results of the comparing, in which the selected one of the APNs is assigned to terminate the application traffic. In some embodiments, the application traffic characteristics include at least one of average data packet size, average uplink traffic volume, average downlink traffic volume, triggering traffic data generation, and session frequency. The method may further include periodically re-comparing the application traffic characteristics with the APNs and selecting a different one of the APNs based on results of the recomparing to terminate the application traffic.

13 Claims, 4 Drawing Sheets

(51) Int. Cl.
H04W 36/08 (2009.01)
H04W 36/22 (2009.01)
H04W 48/18 (2009.01)

(56) References Cited

U.S. PATENT DOCUMENTS

2010/0138565 A1* 6/2010 Brisebois .............. G06F 1/1626
710/18
2012/0296968 A1 11/2012 Lin
2013/0017827 A1* 1/2013 Muhanna .............. H04W 4/005
455/426.1
2014/0003339 A1 1/2014 Jain
2014/0136673 A1 5/2014 Anpat et al.
2014/0226641 A1* 8/2014 Kim ..................... H04W 4/005
370/338

OTHER PUBLICATIONS

"3GPP TS 22.368 V11.5.0 (Jun. 2012) Technical Specification: $3^{rd}$ Generation Partnership Project; Technical Specification Group Services and System Aspects; Service requirements for Machine-Type Communications (MTC); Stage 1 (Release 11)," $3^{rd}$ Generation Partnership Project (3GPP), Valbonne France, Jun. 2012; 25 pages.
"3GPP TR 23.888 V11.0.0 (Sep. 2012) Technical Report: $3^{rd}$ Generation Partnership Project; Technical Specification Group Services and System Aspects; System Improvements for Machine-Type Communications (MTC) (Release 11)," 3rd Generation Partnership Project (3GPP), Valbonne France, Sep. 2012; 165 pages.

* cited by examiner

SELECTIVE ACCESS POINT NAME ASSIGNMENT BASED ON MACHINE-TO-MACHINE TRAFFIC ANALYSIS

TECHNICAL FIELD

This disclosure relates in general to data communications networks and, more particularly, to selective assignment of an Access Point Name ("APN") for Internet of Things ("IOT")/Machine-to-Machine ("M2M") based on M2M traffic analysis.

BACKGROUND

Cellular network-based Machine-to-Machine communications ("M2M"), which are also interchangeably referred to herein as Machine Type Communications ("MTC"), are quickly becoming a market-changing force for a wide spectrum of businesses and applications, such as telematics, smart metering, point-of-sale ("PoS"), and home security and automation systems. M2M communications are about enabling direct communications among electronic devices (referred to as M2M devices) and/or enabling communications between M2M devices and a central M2M server or set of M2M servers. Such communications can occur via both fixed and wireless networks. M2M provides an abundance of applications in a variety of domains, impacting various environments and markets. M2M communications connect M2M devices to the Internet and other networks, forming the so-called "Internet of Things" ("IoT"). Given the forecasted significant market growth over the next several years for both M2M devices and connectivity segments, it is apparent that there will be a significant impact on existing infrastructure. When a new technology, such as M2M communications, emerges, decisions must be made regarding how the new technology can efficiently share existing resources with existing technologies.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

Overview

Figure 1:
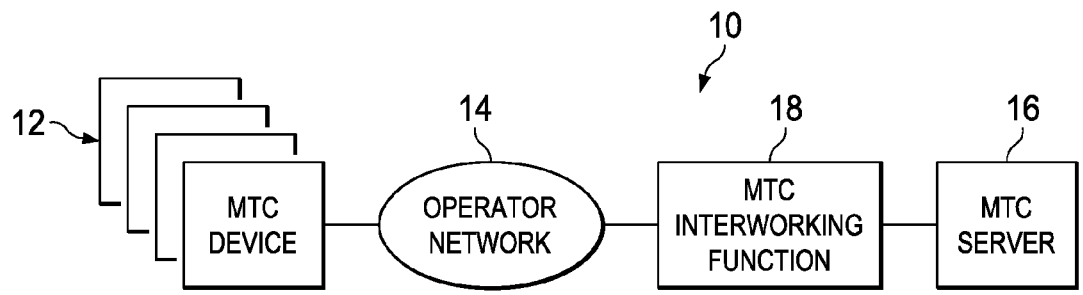
FIG. 1 is a simplified block diagram illustrating an MTC architecture in accordance with embodiments shown and described herein.

A method is provided in one example embodiment and includes analyzing characteristics of traffic associated with an application in a data communications network; and defining each of a plurality of Access Point Names ("APNs") for terminating traffic in the data communications network. The method may further include comparing the application traffic characteristics with the APNs; and selecting one of the APNs based on results of the comparing, in which the selected one of the APNs is assigned to terminate the application traffic. In some embodiments, the application traffic characteristics include at least one of average data packet size, average uplink traffic volume, average downlink traffic volume, triggering traffic data generation, and session frequency.

The method may further include periodically re-comparing the application traffic characteristics with the APNs; and selecting a different one of the APNs based on results of the recomparing, in which the selected different one of the APNs is assigned to terminate the application traffic. In certain embodiments, the application may include a machine-to-machine ("M2M") application. The method may still further include maintaining an indication of the selected one of the APNs a network element; and providing the indication to an end user device during registration of the end user device with the data communications network. The end user device may be implemented as an M2M-type device. In other embodiments, the defining may include analyzing characteristics of the data communications network using data mining techniques; and using the data communications network characteristics to define the plurality of APNs. The data mining techniques may include clustering techniques, decision tree techniques, and case-based reasoning techniques. Similarly, the data communications network characteristics may include bearer session establishment, charging record creation, and quality of service ("QoS") policy initialization mobility, secondary Packet Data Protocol ("PDP") context activation, default Packet Data Network ("PDN") connection, and Gx interactions.

Example Embodiments

M2M traffic exhibits significantly different patterns than smartphone traffic in multiple aspects. For instance, M2M devices have a much larger ratio of uplink-to-downlink traffic volume, their traffic typically exhibits different diurnal patterns, they are more likely to generate synchronized traffic resulting in bursty aggregate traffic volumes, and are less mobile when compared to smartphones. M2M devices are also generally competing with smartphones for network resources in co-located geographical regions. Embodiments described herein provide a better protocol design, more thoughtful spectrum allocation, modification of pricing schemes, and careful structuring of quality of service ("QoS") profiles to accommodate the rise of M2M devices while continuing to accommodate existing technologies.

An important criterion for dimensioning of cellular networks is price per session ("PPS"); i.e., the revenue associated with a Packet Data Protocol ("PDP") context/bearer session. Generally speaking, there is a one-to-one relationship between QoS and Average Revenue Per User ("ARPU") associated with a PDP session. ARPU, which may be defined as total revenue divided by number of subscribers, is a measure used by companies such as Internet service providers and telephone carriers, for example, that offer subscription services to clients. ARPU provides companies with a granular view at a per user or per unit basis, enabling operators more easily to track revenue sources and growth.

M2M applications can be broadly divided into low ARPU and high ARPU applications. There are a number of factors that drive the cost of an M2M, or MTC, application, and correspondingly drive ARPU down. These factors include the number of subscriptions associated with an application, the number of simultaneously attached drivers associated with the application, the number of "always on" connections associated with the application, the number of data sessions associated with the application, and the volume of data throughput associated with the application. In most cases, the "cost" is associated with the need for network components and resources to support the application.

Currently, the M2M traffic associated with both low ARPU and high ARPU applications is carried through the network equally; however, the cost per session associated with each application varies significantly. In accordance with features of embodiments described herein, a technique is provided for analyzing an M2M traffic session application and steering it toward a specific Access Point Name ("APN") to reduce the cost per session.

Traffic characteristics of each application are affected by several factors. One factor that may affect traffic characteristics of an MTC application is the average size of the data packet associated with the application, based on the type of sensor or device network. For example, the typical packet size recommended within a Zigbee-based sensor network is different from that recommended within a 6LowPan-based sensor network. Another factor that may affect traffic characteristics of an MTC application is the triggering traffic data generated based on the type of device network recommendations. In particular, the data carried by the network from the sensor to the network based upon a trigger (such as a smoke alarm message or a valve transmitting a message after exceeding a set threshold value) is called triggering traffic data. This payload (data) may or may not be segmented based on the constraints of the device network protocol and bandwidth available at any given point of time. Yet another factor that may affect traffic characteristics of an MTC application is the average volume of uplink data traffic and downlink data traffic associated with the application. Still another factor that may impact traffic characteristics of an MTC application is the frequency of sessions, both heartbeat and trigger, associated with the application.

The aforementioned factors, as well as others, combine to produce an M2M traffic pattern for a particular M2M application. In accordance with features of embodiments described herein, the traffic pattern of an M2M application, once characterized, may then be matched to certain network characteristics, such as default or dedicated bearer session establishment, charging record creation, and QoS policy initialization. The resulting set of network characteristics can help define (in cases in which the network is in the preplanning stages) and identify (in cases in which the network is in operational mode) the APNs to be used to terminate the application traffic. The embodiments described herein define a dynamic system that matches M2M traffic profiles with APN characteristics and steers the traffic toward the optimal APN for terminating the traffic based on the matching.

As will be understood by those skilled in the art of telecommunications, an APN identifies a gateway between a mobile communications network, such as a cellular data network, controlled by an operator and another network, such as the Internet, and is used in establishing packet data connections. The APN determines how the operator's network passes IP traffic to the destination network. A device making a data connection must be configured with an APN to present to the operator network, which will examine the APN to determine the type of network connection that should be created (e.g., what IP address(es) should be assigned, what security methods should be used, etc.). A structured APN includes a Network Identifier, which defines the external network to which the Gateway GPRS Support Node ("GGSN") is connected, and an Operator Identifier, which defines the specific operator's packet domain network in which the GGSN is located.

Figure 2A:
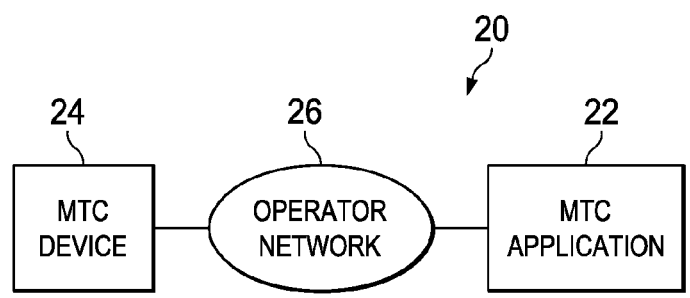
FIGS. 2A-2C illustrate communications models that may be implemented by an MTC architecture in accordance with embodiments shown and described herein.
Figure 2B:
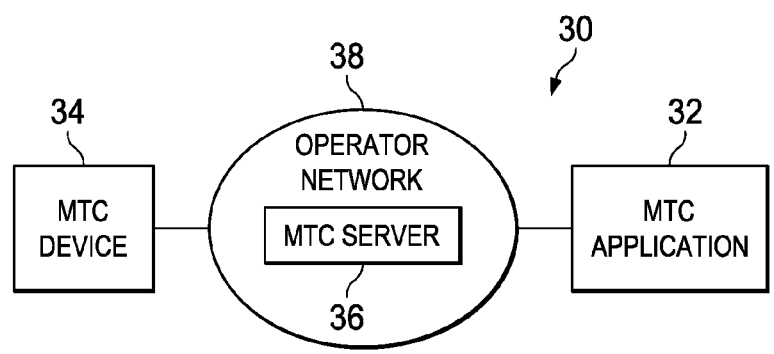
Figure 2C:
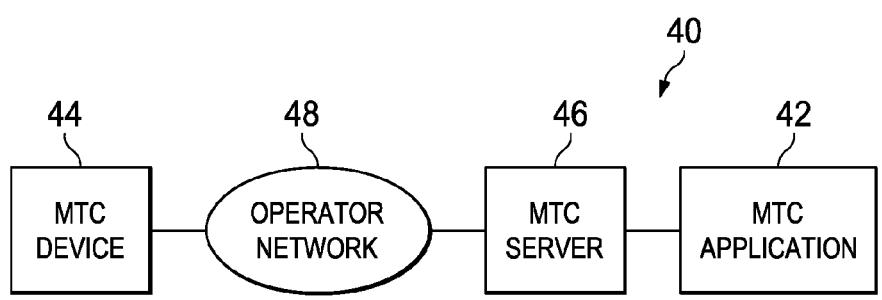

FIG. 1 is a simplified block diagram of an MTC architecture in accordance with embodiments described herein. As shown in FIG. 1, a MTC communications system 10 includes a number of MTC devices 12 operatively connected for communication purposes with an MTC server 14 via an operator network 16 and MTC interworking function 18. As shown in FIGS. 2A-2C, a number of different communication models may be implemented in an MTC system. For example, FIG. 2A illustrates a direct communication model 20, in which an MTC application 22 communicates directly with an MTC device 24 as an over the top ("OTT") application on an operator network 26, which may be implemented as a 3GPP cellular communications network. FIG. 2B illustrates an indirect communication model 30, in which an MTC application 32 communicates with an MTC device 34 via an operator-provided MTC server 36 within an operator network 38. As with the operator network 26 (FIG. 2A), the operator network 38 may be implemented as a 3GPP cellular communications network. The addition of the server 36 allows for the provision of value added services provided by the operator (thus rendering the operator a service provider). The interface between the MTC server and the application 32 remains outside the scope of 3GPP and communications between the MTC server and the mobile network is internal to the Public Land Mobile Network ("PLMN.") FIG. 2C illustrates another arrangement of an indirect communication model 40 in which an MTC application 42 communicates with an MTC device 44 via an MTC server 46 provided by a third party service provider. The addition of the MTC server 44 allows for the provision of additional value added services provided by the service provider, which are outside of the responsibility of the operator of an operator network 48. As with the operator network 26 (FIG. 2A) and the operator network 38 (FIG. 2B), the operator network 48 may be implemented as a 3GPP cellular communications network. The interface between the MTC server 44 and the MTC application 42 are also outside the scope of 3GPP. The MTC server communicates with the 3GPP network through an interface or set of interfaces. Because the indirect communication models shown in FIGS. 2B and 2C are not necessarily mutually exclusive but may be complementary, it is possible that a 3GPP network operator will want to combine them for different applications. For example, a 3GPP network operator may provide certain value added services to an MTC application using an internal MTC server and may additionally offer telecommunications services to a third party service provider. The services provided by an MTC server within a 3GPP network may be either different from those offered by an external MTC server, the same as those offered by the external MTC server, or a subset or superset of those offered by the external MTC server.

Figure 3:
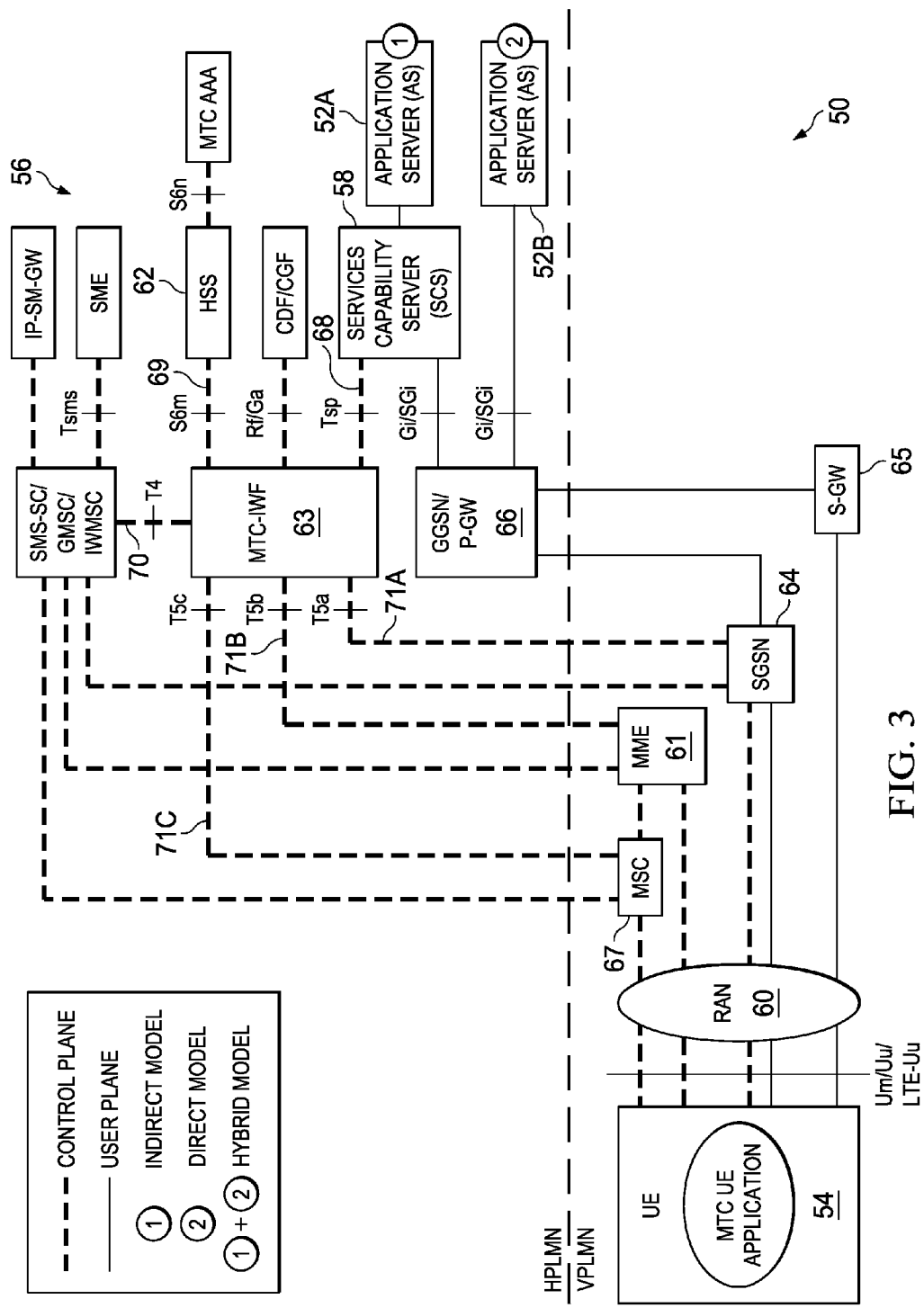
FIG. 3 is a more detailed block diagram illustrating an MTC architecture in accordance with embodiments shown and described herein.

FIG. 3 is a more detailed block diagram of a communications system 50 in which techniques for APN based on M2M traffic analysis may be implemented. As shown in FIG. 3, the system 50 includes one or more MTC servers 52, which may be connected to an MTC device, or MTC user equipment ("UE"), 54 via an operator network 56. In one embodiment, operator network 56 may be implemented as a 3GPP Long Term Evolution ("LTE") network. An MTC server, referred to in FIG. 3 as a Services Capability Server ("SCS") 58, is also provided between the network 56 and the application 52 for implementing an indirect (or a hybrid) communications model and may be bypassed for implementing a direct communications model, as described in FIGS. 2A-2C.

As shown in FIG. 3, the network 56 includes a Radio Access Network ("RAN") 60, which in one embodiment is implemented as an E-UTRAN, in which the RAN nodes comprise eNodeBs; however, it will be recognized that the RAN 60 may also be implemented using radio network controllers ("RNCs") instead of or in addition to eNodeBs for the RAN nodes. In one embodiment, at least a portion of the network 56 may be implemented using a 3GPP network such as defined in 3GPP TS 23.888 v.11 (hereinafter "TS 23.888"), which is hereby incorporated by reference in its entirety. It will be understood, however, that other implementations of the network 56 may be employed in accordance with the features described herein.

As illustrated in FIG. 3, the network 56 may include a mobility management entity ("MME") 61, which is responsible for control plane functions related to subscriber and session management and is connected to a home subscriber service ("HSS") 62, which supports a database that includes user subscription information, through an MTC Interworking Function ("MTC-IWF") 63, described in greater detail below. The network 56 may further include a serving GPRS support node ("SGSN") 64 connected to the MTC-IWF 63 for providing functionality related to packet-data switching. The network 56 may further include a serving gateway ("SGW") 65, which is the termination point of the user plane interface S1-U toward the RAN 56, and a Gateway GPRS Support Node ("GGSN")/PDN gateway ("PGW") 66, which supports policy enforcement features that apply operator-defined rules for resource allocation and usage, as well as packet filtering and inspection and charging support. A mobile switching center ("MSC") 67 may be provided for routing voice calls and SMS messages, setting up and releasing end-to-end connections, managing mobility and handover requirements for a connection, and managing charging and account monitoring.

As shown in FIG. 3, the end-to-end communications between an MTC application in the UE 54 and the MTC application in the external network uses services provided by the 3GPP network, and optionally services provided by the SCS 58. The MTC application in the external network is typically hosted by an application server and may make use of the SCS for additional value added services. The 3GPP network provides transport, subscriber management, and other communication services, including various architectural enhancements motivated by, but not restricted to, MTC (e.g., control plane device triggering).

As previously noted, the network 56 includes an MTC-IWF (i.e., MTC-IWF 63), which is a node that hides the internal PLMN topology and relays or translates signaling protocols used over Tsp to invoke specific functionality (mainly device trigger functionalities) in the PLMN. A MTC-IWF may be a standalone entity or a functional entity of another network element. The SCS 58, noted above, is an entity that connects to the 3GPP network to communicate with UEs used for MTC and the MTC-IWF in the HPLMN. The SCS 58 provides value added services, such as control plane device triggering, to the application server 52A. The SCS 58 may be controlled by either the MTC service provider or the 3GPP mobile network operator. The SCS performs user plane and/or control plane communication with the UE. Application servers 52A and 52B each host one or more external network MTC applications.

Tsp 68 is a Diameter-based interface between the MTC-IWF 63 and one or more SCSes, such as SCS 58. The Tsp interface allows transfer of a device trigger request from the SCS. MTC-IWF authorizes the request, based on interrogation with HSS 62 whether the SCS is allowed to send a device trigger to the identified UE. Based on foregoing, MTC-IWF reports the acceptance or non-acceptance of the device trigger request. MTC-IWF reports to the SCS the success or failure of a device trigger delivery. MTC-IWF also provides congestion and load control information to the SCS, as part of the response to trigger requests. An S6m interface 69 is a Diameter-based interface between MTC-IWF and the HSS/HLR to retrieve subscription information for a UE. The S6m interface 69 allows mapping of an External Identifier ("EI") of the UE to an International Mobile Subscriber Identity ("IMSI") for the UE. The S6m interface allows retrieval of serving node (i.e. SGSN/MME/MSC) information for the UE to determine whether an SCS is allowed to send a device trigger to a particular UE. A T4 interface 70 is a Diameter-based interface between the MTC-IWF and a Short Message Service-Service Center ("SMS-SC") inside the HPLMN that may be used to transfer device trigger (SMS) and MME/SGSN/MSC identifiers to the SMS-SC. The T4 interface 70 may also be used to report to MTC-IWF the submission outcome of a device trigger and the success or failure of delivering the device trigger to the UE. T5a/b/c interfaces 71A-71C are the interfaces between MTC-IWF and Mobility Management nodes (MSC/MME/SGSN), respectively. The T5a/b/c interfaces are not currently defined in 3GPP Release-11.

As previously noted, in one embodiment, the communications system 50 is implemented in accordance with the LTE standard. In LTE, RAN 60 is implemented as an E-UTRAN, which provides the radio access in the LTE network and is designed to improve end-user throughputs and sector capacity and reduce user plan latency, bringing significantly improved user experience with full mobility. With the emergence of IP as the protocol of choice for all types of traffic, LTE provides support for IP-based traffic with end-to-end QoS. E-UTRAN supports various types of services, including web browsing, FTP, video streaming, VoIP, online gaming, real time video, push-to-talk, and push-to-view, for example.

UE 54 can be associated with clients, customers, or end users wishing to initiate a communication in communication system 50 via some network. The term "user equipment" is inclusive of devices used to initiate a communication, such as a computer, a personal digital assistant (PDA), a laptop or electronic notebook, a cellular telephone, an iPhone, an IP phone, or any other device, component, element, or object capable of initiating voice, audio, video, media, or data exchanges within communications system 50. UE 54 may also be inclusive of a suitable interface to the human user, such as a microphone, a display, or a keyboard or other terminal equipment. UE 54 may also be any device that seeks to initiate a communication on behalf of another entity or element, such as a program, a database, or any other component, device, element, or object capable of initiating an exchange within communication system 10. Data, as used herein in this document, refers to any type of numeric, voice, video, media, or script data, or any type of source or object code, or any other suitable information in any appropriate format that may be communicated from one point to another. On power up, UE 54 can be configured to initiate a request for a connection with a service provider. A user agreement can be authenticated by the service provider based on various service provider credentials (e.g., subscriber identity module ("SIM"), Universal SIM ("USIM"), certifications, etc.). More specifically, a device can be authenticated by the service provider using some predetermined financial relationship.

Figures 4, 5:
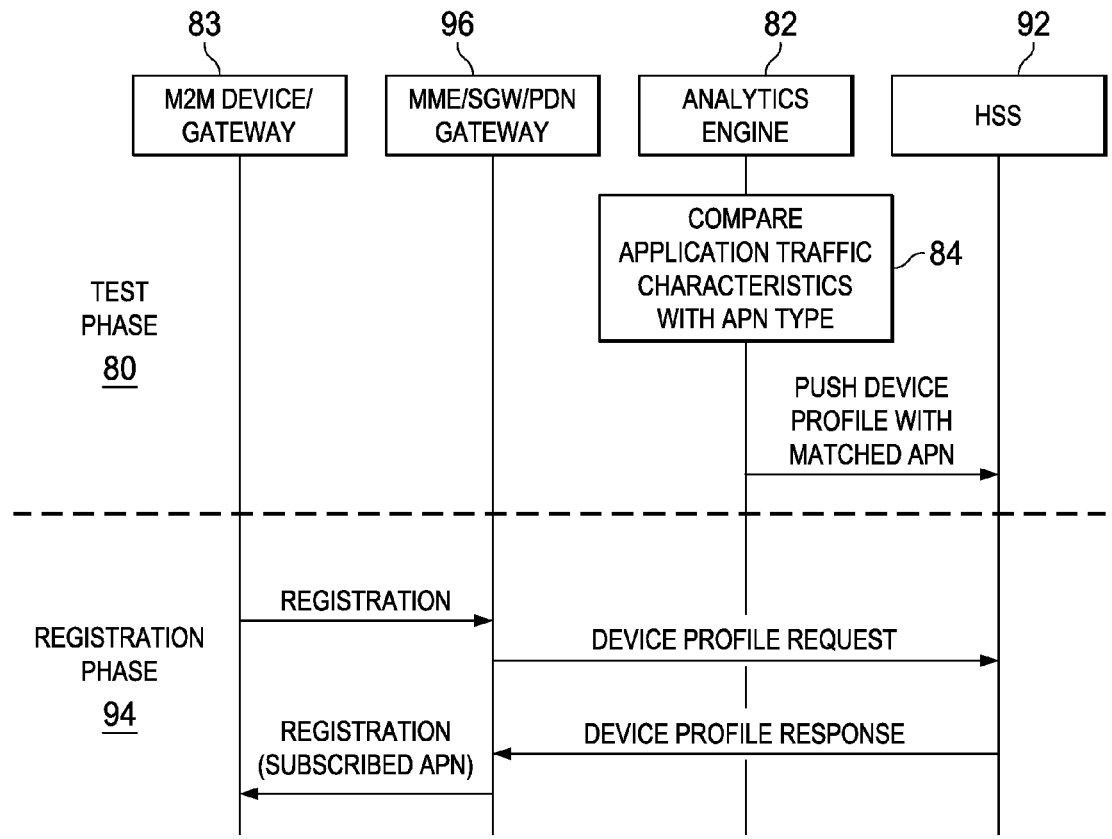
FIG. 4 depicts a flow diagram illustrating example operation of a provisioning call flow in accordance with embodiments shown and described herein for implementing selective APN assignment based on M2M traffic analysis.
FIG. 5 depicts a table showing examples of various characteristics of different "types" of APNs in accordance with embodiments shown and described herein for implementing selective APN assignment based on M2M traffic analysis.

Referring now to FIG. 4, illustrated therein is a flow diagram illustrating example operation of a provisioning call flow in accordance with embodiments described herein. In a test phase 80, an analytics engine 82 compares traffic for a particular MTC application employed by an MTC UE/Gateway 83 with a number of APN "types," as represented in FIG. 4 by a box designated by a reference numeral 84. FIG. 5 depicts a table 90 denoting examples of various characteristics of different "types" of APNs. For example, as shown in the table 90, a first APN type ("APN-1") is defined as lacking support for mobility, secondary PDP context activation, and Gx interactions and supporting only the default PDN connection only. Secondary PDP context activation typically occurs when the service cannot be fully compensated by the primary PDP context; low data applications (like smart meters) are examples of applications that do not require secondary PDP context creation. Gx is a policy interface that exists between the GGSN and the Policy Decision functions. Generally, though not always, the triggering of secondary PDP context is a function of the Policy Decision function, which then relays the message to the GGSN via the Gx interface. Default PDN connection is a term used in 4G/LTE networks; it can be loosely equated to primary PDP context in 2G/3G network.

A second APN ("APN-2") is defined as lacking support for mobility, but supporting dedicated PDN connections and Gx interactions. A third APN ("APN-3") is defined as supporting mobility, dedicated PDN connections, and Gx interactions. On analyzing the traffic characteristics, such as packet size, average volume of uplink and downlink data traffic, session frequency, etc., the analytics engine 82 matches the traffic to a specific predefined APN type (e.g., APN-1, APN2, or APN-3). This information regarding APN assignment is relayed to an HSS 92 along with the identity of the UE and gateway. The HSS 92 stores the APN assigned to the UE/Gateway 83 as part of the default APN parameter of the device profile for the UE.

Subsequently, during a registration phase 94, UE/Gateway 83 requests registration via MME/S-GW/P-GW functionality 96. The functionality 96 sends a device profile request for the UE/Gateway 83 to the HSS 92, which responds with the requested profile. The functionality 96 forwards the device profile, which includes the subscribed APN, to the UE/Gateway 83. In this manner, the MTC traffic of the UE 83 is assigned to the selected APN.

Various data mining approaches may be employed in implementing the analytics engine 82, but first the historical performance of the operator network, through the various traffic parameters over time as well as the policy at that time and a measure of the performance, must be characterized. With this structure in place, classifiers can be built and/or rules determined which can then be tested out on test data and programmed into an analytics engine simulator. A number of other data mining approaches may be implemented, which may provide insights into the behavior of the network. Such other approaches may include "clustering," which determines whether there are categories of traffic and further, if there are, which group ti is in and how well it fits. Outliers can indicate unusual behavior. Indeed, clustering could help determine the traffic pattern and the necessary policy. Another approach may be a "decision tree," in which trees are derived to predict what the important factors in determining the best current policy. Yet another approach is "case-based reasoning," which could result in the build up of a catalogue of past cases and match current situation with the past cases. The user could specify solutions to each of the cases, allowing high knowledge from experts to be mixed with low knowledge of a matching algorithm. The list of APN types may be stored in or in association with the analytics engine, such as in a table or database, for purposes of comparison with network traffic as described herein.

Figure 6:
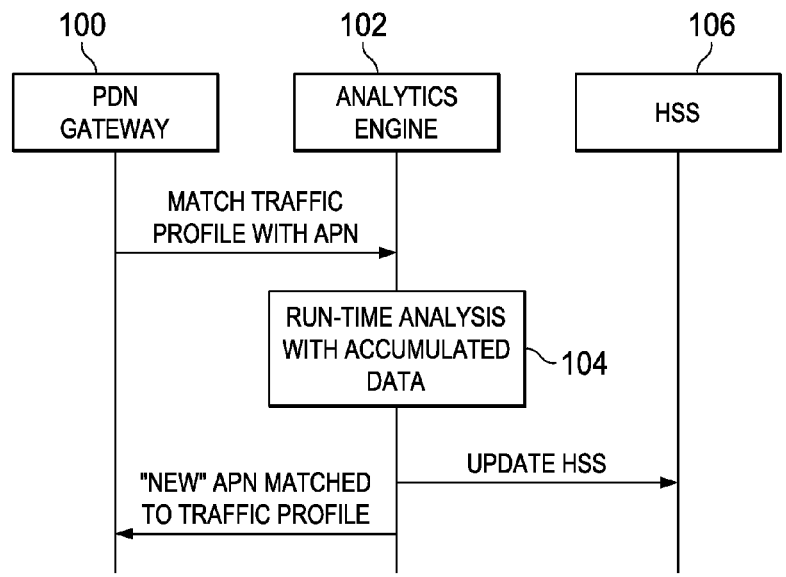
FIG. 6 depicts a flow diagram illustrating a run time call flow method of assigning an APN to M2M user equipment M2M traffic in accordance with embodiments shown and described herein for implementing selective APN assignment based on M2M traffic analysis.

FIG. 6 illustrates flow diagram depicting a run time call flow method of assigning an APN to an MTC UE based on characteristics of the MTC traffic. As shown in FIG. 6, a PDN gateway 100 may send a request to an analytics engine 102 to match a traffic profile with an APN. As represented in block 104, in response to the request, the analytics engine 102 performs a run time analysis on the traffic characteristics based on accumulated data. If a new APN is assigned, the analytics engine 102 sends an update notification to an HSS 106 to update the device profile of the UE with the new APN assignment and then provides the new APN assignment to the PDN gateway 100. The process illustrated in FIG. 6 may be performed periodically or in response to some trigger to ensure that the APN assignment for each MTC UE is constantly optimized.

It will be noted that the analytics engine described herein may be adapted to modify other IP Connectivity Access Network ("IP-CAN") parameters in run time mode. This idea may be adapted to non-M2M devices. In this regard, service class may be used to identify M2M traffic and a similar ploy may be used to identify devices/traffic other than M2M. The output from the analytics engine may be fed into a Gi-LAN gateway to invoke service chaining principles. For example, a typical policy output could be to chain all M2M service through a specific APN, a specific QoS, etc. A further level of granularity may be defined by mapping the service class parameters to a specific chain, allowing a service provider to plan their network(s) in a manner that appeals to and is customized for their enterprise customers, such as utility providers or OEM vendors such as vehicle manufacturers, for example.

Figure 7:
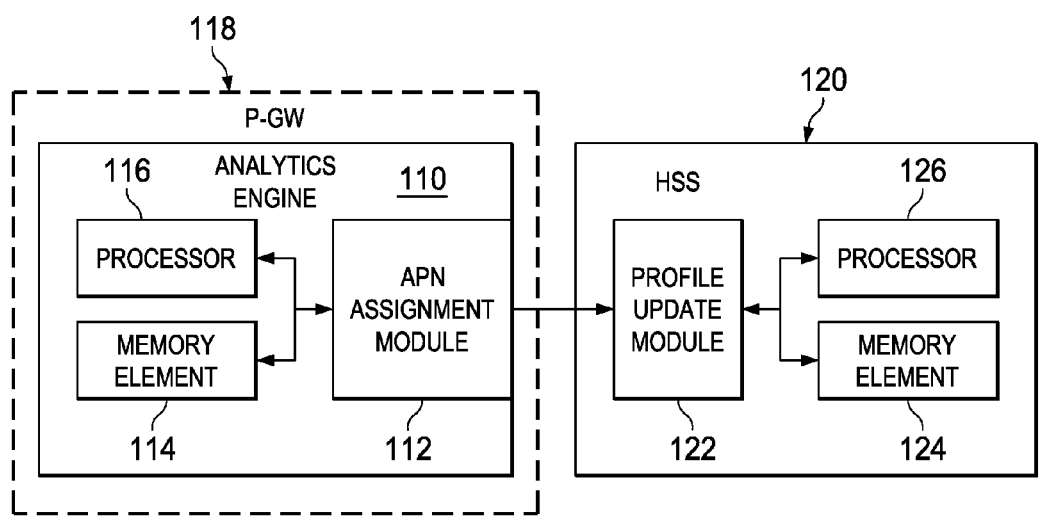
FIG. 7 illustrates example interaction between an analytics engine and an HSS in accordance with embodiments shown and described herein for implementing selective APN assignment based on M2M traffic analysis.

In one example implementation, various devices involved in implementing the embodiments described herein can include software for achieving the described functions. For example, referring to FIG. 7, the analytics engine, represented in FIG. 7 by an analytics engine 110, may include an APN assignment module 112, which comprises software embodied in one or more tangible media for facilitating the activities described herein. The analytics engine 110 may also include a memory device (or memory element) 114 for storing information to be used in achieving the functions as outlined herein. Additionally, the analytics engine 110 may include a processor 116 that is capable of executing software or an algorithm (such as embodied in module 112) to perform the functions as discussed in this Specification. These devices may further keep information in any suitable memory element (random access memory ("RAM"), ROM, EPROM, EEPROM, ASIC, etc.), software, hardware, or in any other suitable component, device, element, or object where appropriate and based on particular needs. Any of the memory items discussed herein should be construed as being encompassed within the broad term "memory element." Similarly, any of the potential processing elements, modules, and machines described in this Specification should be construed as being encompassed within the broad term "processor." Each of the network elements can also include suitable interfaces for receiving, transmitting, and/or otherwise communicating data or information in a network environment. Analytics engine 110 may be implemented as a standalone device or may its functionality may be integrated into P-GW 118 or other network devices or distributed throughout the network as desired.

Additionally, although described with reference to an M2M implementation, the embodiments shown and described herein are equally advantageously applied to an end-to-end solution.

Referring again to FIG. 7, the HSS, represented in FIG. 7 by HSS 120, may include an APN assignment module 122, which comprises software embodied in one or more tangible media for facilitating the activities described herein. The HSS 120 may also include a memory device (or memory element) 124 for storing information to be used in achieving the functions as outlined herein. Additionally, HSS 120 may include a processor 126 that is capable of executing software or an algorithm (such as embodied in module 122) to perform the functions as discussed in this Specification. These devices may further keep information in any suitable memory element (random access memory ("RAM"), ROM, EPROM, EEPROM, ASIC, etc.), software, hardware, or in any other suitable component, device, element, or object where appropriate and based on particular needs. Any of the memory items discussed herein should be construed as being encompassed within the broad term "memory element." Similarly, any of the potential processing elements, modules, and machines described in this Specification should be construed as being encompassed within the broad term "processor." Each of the network elements can also include suitable interfaces for receiving, transmitting, and/or otherwise communicating data or information in a network environment.

Note that in certain example implementations, the functions outlined herein and in FIGS. 4 and 6 may be implemented by logic encoded in one or more tangible media (e.g., embedded logic provided in an application specific integrated circuit ("ASIC"), digital signal processor ("DSP") instructions, software (potentially inclusive of object code and source code) to be executed by a processor, or other similar machine, etc.). In some of these instances, a memory element can store data used for the operations described herein. This includes the memory element being able to store software, logic, code, or processor instructions that are executed to carry out the activities described in this Specification, including but not limited to the functions illustrated in and described with reference to FIGS. 4 and 6. A processor can execute any type of instructions associated with the data to achieve the operations detailed herein in this Specification. In one example, the processor could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array ("FPGA"), an erasable programmable read only memory ("EPROM"), an electrically erasable programmable ROM ("EEPROM")) or an ASIC that includes digital logic, software, code, electronic instructions, or any suitable combination thereof.

It should be noted that much of the infrastructure discussed herein can be provisioned as part of any type of network element. As used herein, the term "network element" or "network device" can encompass computers, servers, network appliances, hosts, routers, switches, gateways, bridges, virtual equipment, load-balancers, firewalls, processors, modules, or any other suitable device, component, element, or object operable to exchange information in a network environment. Moreover, the network elements may include any suitable hardware, software, components, modules, interfaces, or objects that facilitate the operations thereof. This may be inclusive of appropriate algorithms and communication protocols that allow for the effective exchange of data or information.

In one implementation, network elements/devices can include software to achieve (or to foster) the activities discussed herein. This could include the implementation of instances of any of the components, engines, logic, etc. shown in the FIGURES. Additionally, each of these devices can have an internal structure (e.g., a processor, a memory element, etc.) to facilitate some of the operations described herein. In other embodiments, these activities may be executed externally to these devices, or included in some other network element to achieve the intended functionality. Alternatively, these network devices may include software (or reciprocating software) that can coordinate with other network elements in order to achieve the management activities described herein. In still other embodiments, one or several devices may include any suitable algorithms, hardware, software, components, modules, interfaces, or objects that facilitate the operations thereof.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIGURES (and their teachings) are readily scalable and can accommodate a large number of components, as well as more complicated/sophisticated arrangements and configurations. Accordingly, the examples provided should not limit the scope or inhibit the broad teachings of the illustrated topologies as potentially applied to a myriad of other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A method comprising:
    determining characteristics of a data communications network using data mining techniques, wherein the data communications network characteristics include at least one of bearer session establishment, charging record creation, quality of service ("QoS") policy initialization mobility, secondary Packet Data Protocol ("PDP") context activation, default Packet Data Network ("PDN") connection, and Gx interactions;
    defining a plurality of Access Point Names ("APNs") for terminating traffic in the data communications network based on the data communications network characteristics;
    analyzing characteristics of traffic associated with an application executing on a user equipment "UE") in the data communications network;
    comparing the application traffic characteristics with characteristics of the APNs;
    selecting one of the APNs based on results of the comparing, wherein the selected one of the APNs is assigned to terminate the application traffic; and
    maintaining an indication of the selected one of the APNs in a device profile for the UE in a Home Subscriber Server ("HSS") of the data communications network;
    upon expiration of a predetermined time period since the comparing, re-comparing the application traffic characteristics with the APNs; and
    selecting a different one of the APNs based on results of the recomparing, wherein the selected different one of the APNs is assigned to terminate the application traffic.

2. The method of claim 1, wherein the application traffic characteristics include at least one of average data packet size, average uplink traffic volume, average downlink traffic volume, triggering traffic data generation, and session frequency.

3. The method of claim 1, wherein the application comprises a machine-to-machine ("M2M") application.

4. The method of claim 1 further comprising:
    providing the indication to an end user device during registration of the end user device with the data communications network.

5. The method of claim 4 wherein the end user device comprises a machine-to-machine ("M2M") type device.

6. The method of claim 1, wherein the data mining techniques include clustering techniques, decision tree techniques, and case-based reasoning techniques.

7. Non-transitory tangible media that includes code for execution and when executed by a processor is operable to perform operations comprising:
    determining characteristics of a data communications network using data mining techniques, wherein the data communications network characteristics include at least one of bearer session establishment, charging record creation, quality of service ("QoS") policy initialization mobility, secondary Packet Data Protocol ("PDP") context activation, default Packet Data Network ("PDN") connection, and Gx interactions;
    defining a plurality of Access Point Names ("APNs") for terminating traffic in the data communications network based on the data communications network characteristics;
    analyzing characteristics of traffic associated with an application executing on a user equipment "UE") in the data communications network;
    comparing the application traffic characteristics with characteristics of the APNs;
    selecting one of the APNs based on results of the comparing, wherein the selected one of the APNs is assigned to terminate the application traffic; and
    maintaining an indication of the selected one of the APNs in a device profile for the UE in a Home Subscriber Server ("HSS") of the data communications network;
    upon expiration of a predetermined time period since the comparing, re-comparing the application traffic characteristics with the APNs; and
    selecting a different one of the APNs based on results of the recomparing, wherein the selected different one of the APNs is assigned to terminate the application traffic.

8. The media of claim 7, wherein the application traffic characteristics include at least one of average data packet size, average uplink traffic volume, average downlink traffic volume, triggering traffic data generation, and session frequency.

9. The media of claim 7, wherein the application comprises a machine-to-machine ("M2M") application.

10. The media of claim 7, wherein the operations further comprise:
    providing the indication to an end user device during registration of the end user device with the data communications network.

11. An apparatus comprising:
    a memory element configured to store data;
    a processor operable to execute instructions associated with the data; and
    a network element configured to:
        determine characteristics of a data communications network using data mining techniques, wherein the data communications network characteristics include at least one of bearer session establishment, charging record creation, quality of service ("QoS") policy initialization mobility, secondary Packet Data Protocol ("PDP") context activation, default Packet Data Network ("PDN") connection, and Gx interactions;

define a plurality of Access Point Names for terminating traffic in the data communications network based on the data communications network characteristics;

analyze characteristics of traffic associated with an application executing on a user equipment "UE") in the data communications network;

compare the application traffic characteristics with characteristics of the APNs;

select one of the APNs based on results of the comparing, wherein the selected one of the APNs is assigned to terminate the application traffic; and maintain an indication of the selected one of the APNs in a device profile for the UE in a Home Subscriber Server ("HSS") of the data communications network;

upon expiration of a predetermined time period since the comparing, re-compare the application traffic characteristics with the APNs; and select a different one of the APNs based on results of the recomparing, wherein the selected different one of the APNs is assigned to terminate the application traffic.

12. The apparatus of claim 11, wherein the application comprises a machine-to-machine ("M2M") application.

13. The apparatus of claim 11, wherein the network element is further configured to:

provide the indication to an end user device during registration of the end user device with the data communications network.

* * * * *

UNITED STATES PATENT AND TRADEMARK OFFICE
CERTIFICATE OF CORRECTION

PATENT NO. : 9,848,378 B2
APPLICATION NO. : 14/455926
DATED : December 19, 2017
INVENTOR(S) : Sourabh Deepak Anpat et al.

Page 1 of 1

It is certified that error appears in the above-identified patent and that said Letters Patent is hereby corrected as shown below:

In the Specification

In Column 8, Line 11, delete "ti" and insert -- it --, therefor.

In the Claims

In Column 11, Line 46, in Claim 1, delete ""UE")" and insert -- ("UE") --, therefor.

In Column 12, Line 28, in Claim 7, delete ""UE")" and insert -- ("UE") --, therefor.

In Column 13, Line 8, in Claim 11, delete ""UE")" and insert -- ("UE") --, therefor.

Signed and Sealed this
Nineteenth Day of June, 2018

Andrei Iancu
*Director of the United States Patent and Trademark Office*